US012772808B2

(12) United States Patent
Hwang et al.

(10) Patent No.: US 12,772,808 B2
(45) Date of Patent: Oct. 20, 2026

(54) MANUFACTURING METHOD OF SEMICONDUCTOR ELEMENT BY USING EXTREME ULTRA VIOLET

(71) Applicant: SAMSUNG ELECTRONICS CO., LTD., Suwon-si (KR)

(72) Inventors: Youngho Hwang, Suwon-si (KR); Sanghyun Lim, Suwon-si (KR); Jaehong Lim, Suwon-si (KR); Seok Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 631 days.

(21) Appl. No.: 18/210,374

(22) Filed: Jun. 15, 2023

(65) Prior Publication Data

US 2023/0411155 A1 Dec. 21, 2023

(30) Foreign Application Priority Data

Jun. 16, 2022 (KR) ........................ 10-2022-0073721

(51) Int. Cl.
*H10P 76/20* (2026.01)
*H10P 72/00* (2026.01)
*H10P 95/90* (2026.01)

(52) U.S. Cl.
CPC ...... *H10P 76/2041* (2026.01); *H10P 72/0432* (2026.01); *H10P 72/0602* (2026.01); *H10P 95/904* (2026.01)

(58) Field of Classification Search
CPC ............. H10P 76/2041; H10P 72/0432; H10P 72/0602; H10P 95/904; H10P 76/204; H10P 76/2042; H10P 50/691; G03F 7/168; G03F 7/26; G03F 7/38; G03F 7/2004
USPC ............................................ 430/5, 327, 330
See application file for complete search history.

(56) References Cited

U.S. PATENT DOCUMENTS

| | | | |
|---|---|---|---|
| 6,002,108 A | 12/1999 | Yoshioka | |
| 6,040,120 A | 3/2000 | Matsushita et al. | |
| 6,632,281 B2 | 10/2003 | Kitano et al. | |
| 9,023,740 B2 | 5/2015 | Kato | |
| 2002/0014084 A1 | 2/2002 | Kaneda et al. | |
| 2002/0110760 A1* | 8/2002 | Lin | G03F 7/168 430/327 |
| 2008/0160462 A1 | 7/2008 | Hershen et al. | |

(Continued)

FOREIGN PATENT DOCUMENTS

| | | |
|---|---|---|
| JP | 3415404 B2 | 6/2003 |
| JP | 3624127 B2 | 3/2005 |

(Continued)

OTHER PUBLICATIONS

Office Action issued Feb. 26, 2026 by the Korean Ministry of Intellectual Property for KR Patent Application No. 10-2022-0073721.

*Primary Examiner* — Caleen O Sullivan
(74) *Attorney, Agent, or Firm* — Sughrue Mion, PLLC

(57) ABSTRACT

A manufacturing method of a semiconductor element includes: providing a photoresist on a wafer; supplying a first gas, containing oxygen, at a first flow rate to a bake chamber such that oxygen solubility of the photoresist becomes saturated, and supplying a second gas, which is oxygen-free, at a second flow rate to the bake chamber; and performing a bake process on the wafer in the bake chamber.

20 Claims, 10 Drawing Sheets

(56) References Cited

U.S. PATENT DOCUMENTS

| | | | | |
|---|---|---|---|---|
| 2009/0109414 | A1 | 4/2009 | Ito et al. | |
| 2024/0329539 | A1 * | 10/2024 | Tan | G03F 7/36 |

FOREIGN PATENT DOCUMENTS

| | | | |
|---|---|---|---|
| KR | 10-0590355 | B1 | 9/2006 |
| KR | 10-0701578 | B1 | 4/2007 |
| KR | 10-2015-0071457 | A | 6/2015 |
| KR | 10-2022-0031649 | A | 3/2022 |

* cited by examiner

MANUFACTURING METHOD OF SEMICONDUCTOR ELEMENT BY USING EXTREME ULTRA VIOLET

CROSS-REFERENCE TO RELATED APPLICATION

This application is based on and claims priority from Korean Patent Application No. 10-2022-0073721, filed on Jun. 16, 2022, in the Korean Intellectual Property Office, the disclosure of which is incorporated by reference herein in its entirety.

BACKGROUND

Embodiments of the present disclosure relate to a manufacturing method of a semiconductor element by using extreme ultraviolet (EUV).

To implement a semiconductor element on a semiconductor substrate, a photolithography technique including exposure and development processes is used. Recently, due to a down-scaling trend of semiconductor elements, EUV light has been used as a light source of an exposure device, in forming a fine photoresist pattern on a semiconductor substrate.

In this case, when a photoresist is applied on a wafer, the degree of defects of a semiconductor product may vary depending on the degree of moisture exposure of the photoresist in a bake process after the exposure process. Thus, there is a need for a manufacturing method of a semiconductor element capable of minimizing the degree of defects of a semiconductor product during a delay time of the bake process.

SUMMARY

Embodiments of the present disclosure provide a manufacturing method of a semiconductor element capable of improving the reliability of wafer processing, by preventing a change in a wafer due to a post exposure delay (PED) between an exposure process and a bake process.

The problems solved by embodiments of the present disclosure are not limited to the above-mentioned problems, and other solved problems not mentioned may be clearly understood by those of ordinary skill in the art from the following descriptions.

According to embodiments of the present disclosure, a manufacturing method of a semiconductor element is provided. The manufacturing method includes: providing a photoresist on a wafer; supplying a first gas, containing oxygen, at a first flow rate to a bake chamber such that oxygen solubility of the photoresist becomes saturated, and supplying a second gas, which is oxygen-free, at a second flow rate to the bake chamber; and performing a bake process on the wafer in the bake chamber.

According to embodiments of the present disclosure, a manufacturing method of a semiconductor element is provided. The manufacturing method includes: performing an exposure process in which a wafer is exposed at an exposure amount of 55 mJ to 60 mJ; supplying a first gas, containing oxygen, at a first flow rate to a bake chamber, and supplying a second gas, which is oxygen-free, at a second flow rate to the bake chamber; loading the wafer into the bake chamber after performing the exposure process; performing a bake process on the wafer after loading the wafer into the bake chamber; and performing a development process on the wafer after performing the bake process.

According to embodiments of the present disclosure, a manufacturing method of a semiconductor element is provided. The manufacturing method includes: providing a photoresist on a wafer; supplying a first gas, containing oxygen, at a first flow rate to a bake chamber, and supplying a second gas, which is oxygen-free, at a second flow rate to the bake chamber; and performing a first bake process on the wafer in the bake chamber, wherein, in the performing of the first bake process, a sum of the first flow rate of the first gas and the second flow rate of the second gas supplied to the bake chamber is reduced to be less than a predetermined reference flow rate, and a gas inside the bake chamber is not exhausted.

BRIEF DESCRIPTION OF DRAWINGS

Embodiments will be more clearly understood from the following detailed description taken in conjunction with the accompanying drawings in which.

DETAILED DESCRIPTION

Figure 1:
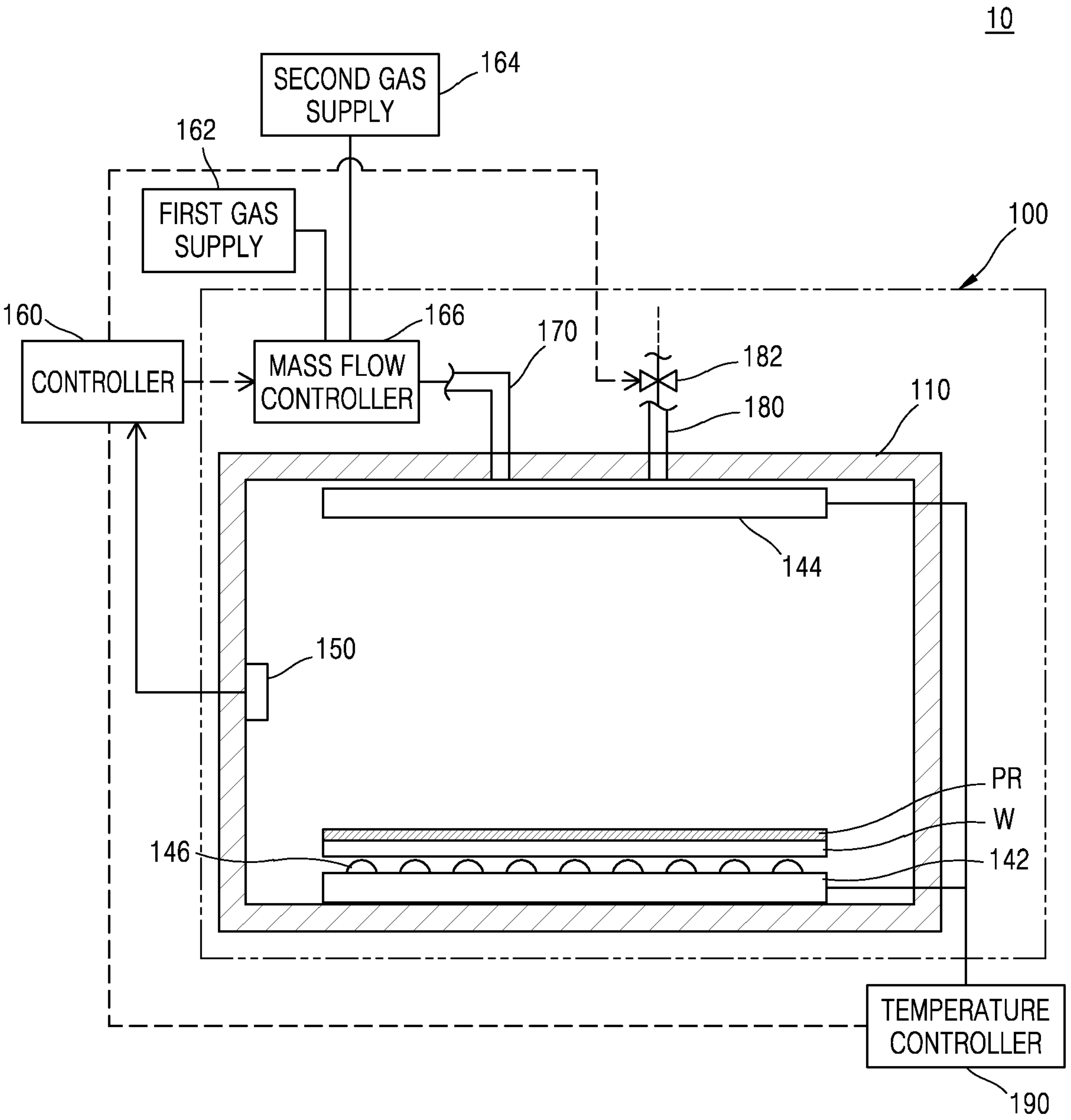
FIG. 1 is a plan view of a semiconductor element manufacturing system according to an embodiment.

Hereinafter, non-limiting example embodiments of the present disclosure are described in detail with reference to the accompanying drawings. Identical reference numerals are used for the same components in the drawings, and a duplicate description thereof will be omitted. In the drawings, a thickness or size of each layer may be exaggerated for convenience and clarity of description, and thus may differ from an actual shape or ratio.

It will be understood that when an element is referred to as being "over," "above," "on," "below," "under,"

"beneath," "connected to" or "coupled to" another element, it can be directly over, above, on, below, under, beneath, connected or coupled to the other element or intervening elements may be present. In contrast, when an element is referred to as being "directly over," "directly above," "directly on," "directly below," "directly under," "directly beneath," "directly connected to" or "directly coupled to" another element, there are no intervening elements present.

FIG. 1 is a plan view of a semiconductor element manufacturing system 10 according to an embodiment.

Referring to FIG. 1, the semiconductor element manufacturing system 10 may include a first gas supply 162, a second gas supply 164, a temperature controller 190, a controller 160, a mass flow controller (MFC) 166, and a semiconductor element manufacturing device 100.

In this case, the semiconductor element manufacturing device 100 may include a bake chamber 110, a first heating plate 142, a second heating plate 144, a humidity measurement device 150, a gas supply tube 170, and an exhaust tube 180.

The bake chamber 110 may have a cylindrical shape having a space, in which a process is performed. The bake chamber 110 may be configured to isolate a region, in which a bake process is performed, from the outside. The exhaust tube 180, through which gas is exhausted, may be connected to an upper surface of the bake chamber 110. An exhaust valve 182 may be installed on the exhaust tube 180, and may open and close a passage therein.

Each of the first gas supply 162 and the second gas supply 164 may also be referred to as a gas supply device. The first gas supply 162 and the second gas supply 164 may supply gas into the bake chamber 110. The first gas supply 162 and the second gas supply 164 may include a gas supply source, the gas supply tube 170, and the MFC 166. In addition, the gas supply tube 170, through which gas is supplied, may be connected to the upper surface of the bake chamber 110. The MFC 166 may be installed on the gas supply tube 170. The first gas supply 162 may supply the first gas to the bake chamber 110 via the gas supply tube 170. The second gas supply 164 may supply the second gas to the bake chamber 110 via the gas supply tube 170. The MFC 166 may adjust a flow rate of a first gas from the first gas supply 162 to a first flow rate. The MFC 166 may adjust a flow rate of a second gas from the second gas supply 164 to a second flow rate.

A wafer W loaded into the bake chamber 110 may be placed on the first heating plate 142. According to some embodiments, the first heating plate 142 may heat the wafer W to a set temperature. According to some embodiments, the first heating plate 142 may support and fix the wafer W while various semiconductor element manufacturing processes are performed on the wafer W. The first heating plate 142 may maintain the temperature of the wafer W at the set temperature. The second heating plate 144 may face surfaces of the wafer W and a photoresist PR. The second heating plate 144 may be apart from the surface of the photoresist PR by a certain distance. The second heating plate 144 may heat the wafer W to a set temperature.

The process, which may be performed on the wafer W while the wafer W is mounted in the semiconductor element manufacturing device 100 and supported by the first heating plate 142, may include i) a thermal oxidation process for forming an oxide layer, ii) a lithography process including spin coating, exposure, and development, iii) a thin layer deposition process, and iv) a dry or wet etching process. In other words, the first heating plate 142 may include a chucking device for supporting the wafer W and maintaining the temperature of the wafer W in an arbitrary semiconductor element manufacturing process, in which the temperature of the wafer W is maintained at a set temperature.

The thin layer deposition process, which may be performed on the wafer W, may be any one of, for example, atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and direct current (DC) magnetron sputtering.

A dry etching process, which can be performed on the wafer W, may include, any one of, for example, reactive ion etching (RIE), deep RIE (DRIE), ion beam etching (IBE), and argon (Ar) milling. In another example, the dry etching process, which can be performed on the wafer W, may include atomic layer etching (ALE). In addition, the wet etching process, which may be performed on the wafer W, may include an etching process using, as an etchant gas, at least any one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS.

According to some embodiments, a planarization process, such as a chemical mechanical polishing (CMP) process, an ion implantation process, a photolithography process, and the like may be performed on the wafer W.

The wafer W may include, for example, silicon (Si). The wafer W may include a semiconductor element, such as germanium (Ge), or a compound semiconductor, such as silicon carbide (SiC), gallium arsenide (GaAs), indium arsenide (InAs), and indium phosphor (InP). The wafer W may include a first surface, that is, an active surface, and a second surface, that is, an inactive surface, opposite to the first surface. The wafer W may be arranged on the first heating plate 142 such that the second surface of the wafer W faces the first heating plate 142.

A heating plate (e.g., the first heating plate 142 and/or the second heating plate 144) may include temperature sensors. The temperature sensors may be embedded in the heating plate. However, embodiments of the present disclosure are not limited thereto, and the temperature sensors may be arranged on an upper surface or a lower surface of the heating plate. The temperature sensors may sense the temperature of the heating plate. The temperature sensors may be arranged in a certain arrangement in a central area, a periphery area, and an intermediate area between the central area and the periphery area of the heating plate.

The temperature controller 190 may set a first temperature of the first heating plate 142. In addition, the temperature controller 190 may set a second temperature of the second heating plate 144. The temperature controller 190 may receive first and second temperatures, which are temperature measurements, measured by the temperature sensors. The temperature controller 190 may transmit the measured first and second temperatures to the controller 160.

The humidity measurement device 150 may be in the bake chamber 110. In some embodiments, the humidity measurement device 150 may be configured to measure the humidity inside the bake chamber 110. In this case, the humidity may be a relative humidity or an absolute humidity. The humidity measurement device 150 may measure humidity inside the bake chamber 110 in real time, and transmit the measured humidity to the controller 160.

The controller 160 may control each of the MFC 166, the temperature controller 190, and the exhaust valve 182. The MFC 166 may receive a flow control signal from the controller 160. The MFC 166 may adjust the flow of the first gas supplied by the first gas supply 162, based on the flow control signal. In addition, the MFC 166 may adjust the flow of the second gas supplied by the second gas supply 164, based on the flow control signal. In some embodiments, the controller 160 may open and close the exhaust valve 182.

Figure 2:
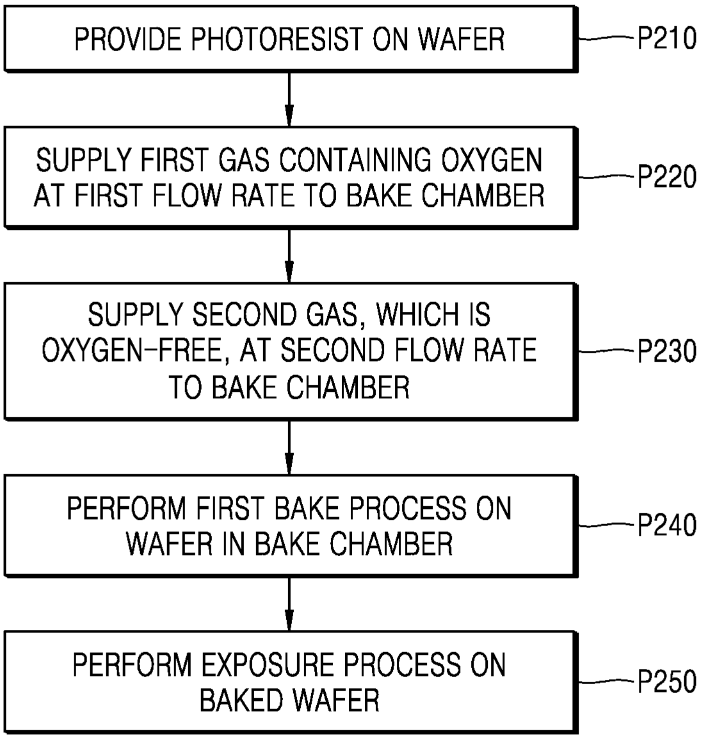
FIG. 2 is a flowchart of a manufacturing method of a semiconductor element, according to an embodiment.

FIG. 2 is a flowchart of a manufacturing method of a semiconductor element, according to an embodiment.

Referring to FIG. 2, the photoresist PR may be provided on the wafer W (operation P210). Materials constituting the photoresist PR may be sensitive to any one of ultraviolet (UV) rays, deep UV (DUV) rays, extreme UV (EUV) rays, excimer laser beams, X-rays, and electrons. In the case of the EUV exposure process, because the number of photons during exposure is less than that of other exposure processes, such as DUV, it may be required to use a material having a high EUV absorption rate. Accordingly, the photoresist PR material for an EUV application may include, for example, hydroxy styrene, which is a polymer. Furthermore, iodophenol may be provided as an additive to the EUV photoresist PR.

According to some embodiments, the thickness of the photoresist PR may range from about 0.1 μm to about 2 μm. According to some embodiments, the thickness of the photoresist PR may range from about 200 nm to about 600 nm. In the case of the EUV photoresist PR, the EUV photoresist PR may be provided to have a thin thickness by spin-coating a photoresist solution having a dilute concentration.

In some cases, the photoresist PR may include an inorganic material, such as tin oxide. In this case, even when the photoresist PR is removed by using a strip process after the lithography process and the subsequent process are completed, an inorganic material may remain in the lower layer of the photoresist PR at a concentration of about 1×1011/$cm^3$ or less. When an inorganic material is used as the photoresist PR, it may be easy to reduce the thickness of the photoresist PR, and because etching selectivity is high, a hard mask layer to be described below may be implemented thin.

In this case, the photoresist PR may be provided by using a CVD or spin coating method.

Referring to FIGS. 1 and 2, the semiconductor element manufacturing device 100 may supply the first gas at the first flow rate from the first gas supply 162 to the bake chamber 110 (operation P220). The first gas may include gas containing oxygen. For example, the first gas may include at least one of oxygen ($O_2$), water vapor ($H_2O$), and nitrogen dioxide ($NO_2$). In another example, the first gas may include reactive oxygen species (ROS), such as singlet oxygen, superoxide anion ($O_2^-$), peroxide ($O_2^{2-}$), hydrogen peroxide ($H_2O_2$), hydroxyl radical (OH), and hydroxyl ion ($OH^-$), ozone ($O_3$), carbon dioxide ($CO_2$), sulfuric acid ($SO_2$), etc.

In this case, oxygen contained in the first gas may include all possible isotopes. For example, the atomic weight of oxygen contained in the first gas may be any one of 16, 17, and 18.

The semiconductor element manufacturing device 100 may supply the second gas at the second flow rate from the second gas supply 164 to the bake chamber 110 (operation P230). The second gas may include an oxygen-free gas. The oxygen-free gas may include a gas including a gas, which does not contain an oxygen atom (O). According to some embodiments, the second gas may not contain the water vapor ($H_2O$) in the air. According to some embodiments, the second gas may be oxygen ($O_2$)-free. According to some embodiments, the second gas may be nitrogen dioxide ($NO_2$)-free. According to some embodiments, the second gas may selectively not include oxygen ($O_2$), water vapor ($H_2O$), and nitrogen dioxide ($NO_2$).

The first gas and the second gas may be mixed before being supplied to the bake chamber 110. The first flow rate of the first gas and the second flow rate of the second gas may be adjusted by the MFC 166. The first gas and the second gas may be supplied before the wafer W is loaded into the bake chamber 110.

The first bake process may be performed by heating the wafer W in the bake chamber 110 (operation P240). The first bake process may include a soft bake process. The soft bake process, also referred to as a pre-bake process, may include a process of removing an organic solvent, which remains on a coating layer (for example, the photoresist PR), and strengthening bonding between the coating layer (for example, the photoresist PR) and the wafer W. The first bake process may be performed at a relatively low temperature. The first bake process may include a bake process performed on the wafer W before exposure. According to some embodiments, the first bake process may be performed on the photoresist PR for about 40 seconds to about 100 seconds at a temperature of about 80 degrees to about 100 degrees.

According to some embodiments, the controller 160 may adjust the first flow rate of the first gas and the second flow rate of the second gas, based on the temperature near the wafer W during the first bake process. The controller 160 may generate first and second flow rate control signals, based on the temperature. The MFC 166 may adjust the first flow rate of the first gas supplied to the bake chamber 110, based on the first flow rate control signals. In addition, the MFC 166 may adjust the second flow rate of the second gas supplied to the bake chamber 110, based on the second flow rate control signals.

According to some embodiments, the controller 160 may adjust a flow rate ratio, which is a ratio of the second flow rate of the first gas to the first flow rate of the second gas. Unless otherwise explicitly specified, the flow rate ratio referred to below may be defined by the following Equation 1.

$$\text{flow rate ratio} = \frac{\text{second flow rate}}{\text{first flow rate}} \quad \text{(Equation 1)}$$

According to embodiments, the controller 160 may control the MFC 166 such that the flow rate ratio is about 0.1 to about 1.5. According to embodiments, the controller 160 may control the MFC 166 such that the flow rate ratio is about 0.1 to about 0.5. According to embodiments, the controller 160 may control the MFC 166 such that the flow rate ratio is about 0.2 to about 0.4.

According to embodiments, based on the temperature in the bake chamber 110 increasing, the controller 160 may reduce the flow rate ratio. According to embodiments, based on the temperature in the bake chamber 110 decreasing, the controller 160 may increase the flow rate ratio.

The controller 160 may adjust the first flow rate of the first gas and the second flow rate of the second gas, based on the humidity inside the bake chamber 110 during the first bake process. The controller 160 may control the flow rate ratio such that the relative humidity inside the bake chamber 110 is about 50% to about 80%.

According to embodiments, the controller 160 may increase the flow rate ratio based on the humidity in the bake chamber 110 being in the range of about 80% to about 95%. According to embodiments, the controller 160 may increase the flow rate ratio based on the humidity in the bake chamber 110 being in the range of about 83% to about 85%. According to embodiments, the controller 160 may decrease the flow rate ratio based on the humidity in the bake chamber 110 being in the range of about 65% to about 80%. According to embodiments, the controller 160 may decrease the flow rate ratio based on the humidity in the bake chamber 110 being in the range of about 75% to about 77%.

According to embodiments, when the first gas includes water vapor ($H_2O$) and the relative humidity in the bake chamber 110 is in the range of about 85% to about 95%, the controller 160 may adjust the flow rate ratio to about 0.5 to about 0.6. According to embodiments, when the first gas includes water vapor ($H_2O$) and the relative humidity in the bake chamber 110 is in the range of about 65% to about 75%, the controller 160 may adjust the flow rate ratio to about 0.2 to about 0.3.

The exposure process may be performed on the baked wafer W (operation P250). In general, the exposure process using an EUV radiation beam may be performed in a reduced projection method. Accordingly, because a pattern formed on a lithography mask has a larger threshold dimension than a pattern to be mapped to an actual wafer W, the reliability of the lithography process may be improved.

In this case, the exposure method may be classified into a scanning method of continuously photographing and a step method of photographing step by step. In general, the EUV exposure process may be performed in the scanning method, and the EUV exposure device may be generally referred to as a scanner. In addition, in the EUV exposure device, scanning may be performed by using a slit, which limits light to some area of the lithography mask. In this case, the slit may include a unit, which limits light in a device performing the EUV exposure process so that light is uniformly irradiated on an EUV photomask. Although light is limited to be irradiated to some area of the EUV photomask through the slit, light may be continuously irradiated while the EUV photomask is moved in a direction opposite to a direction of scanning. As described above, the area, in which light is irradiated on a test wafer W by scanning the total area of the EUV photomask, may include an area corresponding to a full shot.

Figure 3:
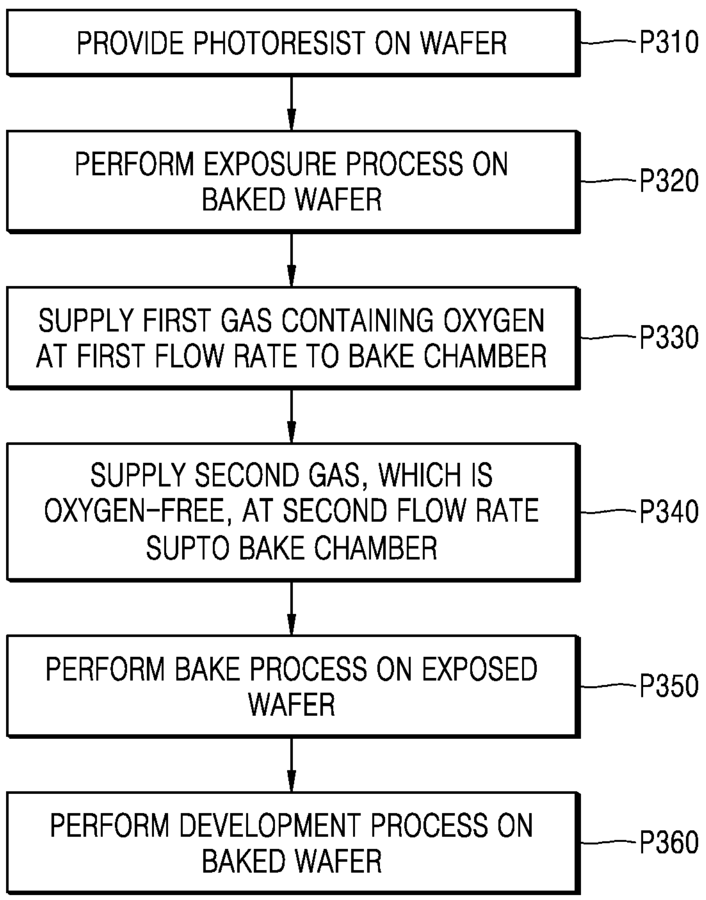
FIG. 3 is a flowchart of a method of performing a bake process after an exposure process, according to an embodiment.

FIG. 3 is a flowchart of a method of performing a bake process after the exposure process, according to an embodiment.

Referring to FIGS. 1 and 3, the photoresist PR may be provided on the wafer W (operation P310). The method of providing the photoresist PR may be the same as that of operation P210 described above with reference to FIG. 2.

The exposure process may be performed on the baked wafer W (operation P320). According to embodiments, in the exposure process, the exposure dose for each wafer full shot may be in the range of about 55 mJ to about 60 mJ. According to embodiments, in the exposure process, the exposure dose for each wafer full shot may be in the range of about 45 mJ to about 65 mJ. According to embodiments, in the exposure process, the exposure dose for each wafer full shot may be in the range of about 50 mJ to about 75 mJ. According to embodiments, in the exposure process, the exposure dose for each wafer full shot may be reduced to be in the range of about 53 mJ to about 57 mJ. In some embodiments, by adjusting the exposure time, the amount of exposure dose may be adjusted. In this case, the exposure amount may be a value in a range that is about 10% less than the existing exposure dose.

The first gas containing oxygen may be supplied at the first flow rate to the bake chamber 110 (operation P330). In addition, the second gas without oxygen may be supplied at a second flow rate to the bake chamber 110. The flow rate ratio of the second flow rate of the second gas to the first flow rate of the first gas in the bake chamber 110 may be maintained at about 75% to about 85%.

In embodiments, the first gas and the second gas may be supplied for about 30 seconds to about 10 minutes, and the saturate oxygen solubility of the photoresist PR before the bake process. In embodiments, the first gas and the second gas may be supplied for about 1 minute to about 5 minutes, and the saturate oxygen solubility of the photoresist PR before the bake process. In this case, the first gas and the second gas may be supplied before the bake process performed on the wafer W starts. In embodiments, the first gas and the second gas may be supplied before the wafer W is loaded into the bake chamber 110.

Before the wafer W is loaded into the bake chamber 110, a sum of the first flow rate of the first gas and the second flow rate of the second gas supplied to the bake chamber 110 may be increased to be more than a reference flow rate. In addition, when the wafer W is loaded into the bake chamber 110, the sum of the first flow rate of the first gas and the second flow rate of the second gas supplied to the bake chamber 110 may be reduced from the reference flow rate.

In embodiments, the reference flow rate may be in the range of about 50 lpm to about 120 lpm. In embodiments, the reference flow rate may be in the range of about 60 lpm to about 110 lpm. In embodiments, the reference flow rate may be in the range of about 65 lpm to about 105 lpm. In embodiments, the increased or reduced sum of the first flow rate and the second flow rate may be about 30% of the reference flow rate.

Figure 6:
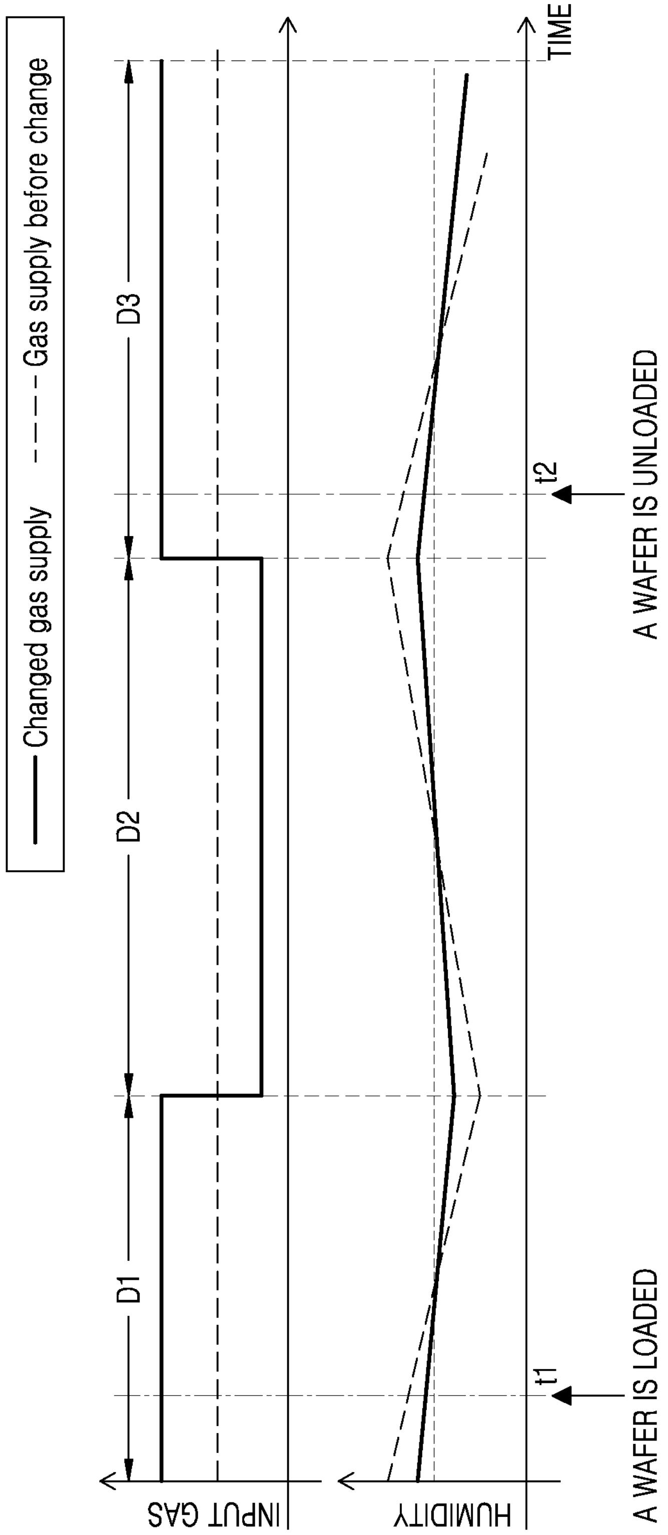
FIG. 6 is a schematic graph of an experiment example generated by a manufacturing method of a semiconductor element, according to another embodiment.

FIG. 6 is a schematic graph of an experiment example generated by a manufacturing method of a semiconductor element, according to another embodiment.

In FIG. 6, the sum of the first flow rate and the second flow rate of the experiment example is illustrated as a solid line, and the humidity in the bake chamber 110 of the experiment example is illustrated as another solid line. The sum of the first flow rate and the second flow rate of a comparison example is illustrated as a dashed line, and the humidity in the bake chamber 110 of the comparison example is illustrated as another dashed line.

Referring to FIG. 6, in a wafer loading period D1, the sum of the first flow rate and the second flow rate of the experiment example may be greater than the reference flow rate. In the wafer loading period D1, the sum of the first flow rate and the second flow rate of the comparison example may be less than the sum of the first flow rate and the second flow rate of the experiment example.

In a wafer processing period D2, the sum of the first flow rate and the second flow rate of the experiment example may be less than the reference flow rate. In the wafer processing period D2, the sum of the first flow rate and the second flow rate of the comparative example may be greater than the sum of the first flow rate and the second flow rate of the experiment example.

In a wafer unloading period D3, the sum of the first flow rate and the second flow rate of the experiment example may be greater than the reference flow rate. In the wafer unloading period D3, the sum of the first flow rate and the second flow rate of the comparison example may be less than the sum of the first flow rate and the second flow rate of the experiment example.

According to embodiments, the sum of the first flow rate and the second flow rate of the experiment example may be variable. According to embodiments, the sum of the first flow rate and the second flow rate of the comparison example may be constant.

According to the experiment example, the sum of the first flow rate and the second flow rate during the wafer processing period D2 may be different from the sum of the first flow rate and the second flow rate during the wafer loading period D1. According to the experiment example, the sum of the first flow rate and the second flow rate during the wafer processing period D2 may be less than the sum of the first flow rate and the second flow rate of the experiment example during the wafer loading period D1.

According to the experiment example, the sum of the first flow rate and the second flow rate during the wafer unloading period D3 may be different from the sum of the first flow rate and the second flow rate during the wafer processing period D2. According to the experiment example, the sum of the first flow rate and the second flow rate during the wafer unloading period D3 may be greater than the sum of the first flow rate and the second flow rate of the experiment example during the wafer processing period D2.

According to the experiment example, the sum of the first flow rate and the second flow rate during the wafer unloading period D3 may be substantially the same as the sum of the first flow rate and the second flow rate of the experiment example during the wafer loading period D1.

According to the comparison example, the sum of the first flow rate and the second flow rate during the wafer processing period D2 may be substantially the same as the sum of the first flow rate and the second flow rate during the wafer loading period D1. According to the comparison example, the sum of the first flow rate and the second flow rate during the wafer unloading period D3 may be substantially the same as the sum of the first flow rate and the second flow rate during the wafer processing period D2.

The maximum value of the humidity of the experiment example may be less than the maximum value of the humidity of the comparison example, and the minimum value of the humidity of the experiment example may be greater than the minimum value of the comparison example. In other words, it has been identified that the humidity of the experiment example is more uniform than the humidity of the comparison example. In this case, the uniformity of humidity may be quantified as a deviation or a peak-to-peak value. In other words, because the peak-to-peak value of the humidity of the experiment example is less than the peak-to-peak value of the humidity of the comparison example, the humidity of the experiment example is more uniform than the humidity of the comparison example.

The controller 160 may adjust the first flow rate of the first gas and the second flow rate of the second gas, based on the temperature and humidity near the wafer W (operation P330 and operation P340). The flow rate control method of the controller 160 may be the same as the flow rate control method described with respect to operation P240.

A second bake process may be performed on the exposed wafer W (operation P350). The second bake process may include a soft bake process, a post exposure bake (PEB) process, and a hard bake process. The hard bake may be a process of flattening a curvature, which is formed on the surface of the photoresist PR, as the intensity of light becomes uneven due to a standing wave formed during the exposure process. In addition, the hard bake may activate a photoactive compound (PAC) contained in the photoresist PR, and accordingly, the curvature formed on the photoresist PR may be reduced.

The hard bake may include a process for improving durability against etching and for increasing adhesion to the wafer W (or an underlying layer), by curing the photoresist PR after performing the exposure and development processes. The hard bake process may be performed at a relatively high temperature, compared to the soft bake process.

A development process may be performed on the baked wafer W (operation P360). The development process may include a process of removing exposed or non-exposed portions of a coating layer. The development process may include spraying developer onto the wafer W and then spinning the wafer W to coat the developer evenly over the entire surface of the wafer W, or immersing the wafer W in the developer for a certain time. An exposed portion (or non-exposed portion) of the photoresist PR may be removed by using the development process. According to some embodiments, after the development process, a cleaning process using deionized water or the like may be further performed on the wafer W to remove contaminated particles.

Figure 4:
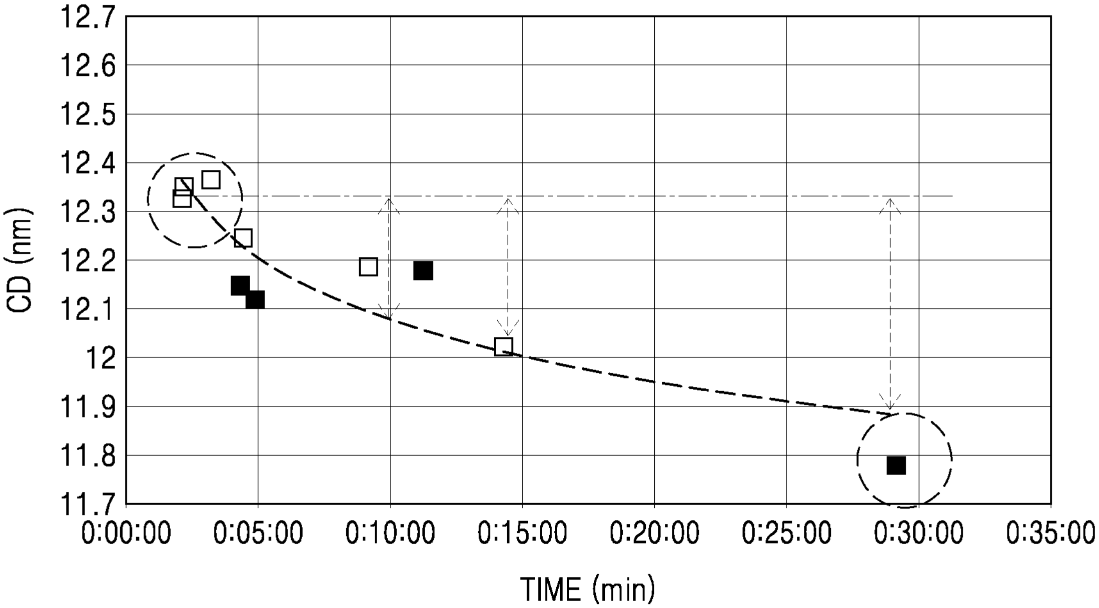
FIG. 4 is a graph of a process critical dimension (CD) change due to post exposure delay (PED) after an exposure process until a bake process performed on a wafer.

FIG. 4 is a graph of a process critical dimension (CD) change due to the post exposure delay (PED) after the exposure process until the bake process performed on the wafer W. In FIG. 4, the vertical axis may represent the CD (or ratio), and the horizontal axis may represent time. In addition, the unit of the vertical axis may be percentage (%, nm), and the unit of the horizontal axis may be minutes. In this case, the CD may be referred to as the distance between patterns.

Referring to FIG. 4, performance of the bake process after the exposure process may be delayed for each of a plurality of wafers. In this case, as the PED value of the wafer W increases, the process CD may decrease. When the PED value is about 5 minutes, a change of about 1% may occur in the process CD. In addition, when the PED value is about 10 minutes, a change of about 2% may occur in the process CD. In addition, when the PED value is about 15 minutes, a change of about 3% may occur in the process CD. In a general process environment, the variation of the process CD may be managed at a level of about 3% to about 5%. Accordingly, considering the general manufacturing process scattering (a level of about 1% to about 2%), the variation of the process threshold dimension due to the moisture contact time may be required to be controlled to about 1% to about 3%.

It has been identified that even though the process CD according to the PED decreases overall, as the PED value increases, a reduction range gradually decreases. In other words, due to the PED, it has been confirmed that as the exposure time of moisture of the photoresist PR increases, the value of the process CD continuously changes to a certain value. In this manner, it has been confirmed that the process CD may be maintained constant, by saturating the oxygen solubility of the photoresist PR.

FIGS. 5A-D are graphs of the effects of a manufacturing method of a semiconductor element, according to embodiments.

In FIGS. 5A-D, time point t1 may be a time point at which an exposure process starts to be performed, and time point t2 may be a time point at which the PEB process starts to be performed.

Figure 5A:
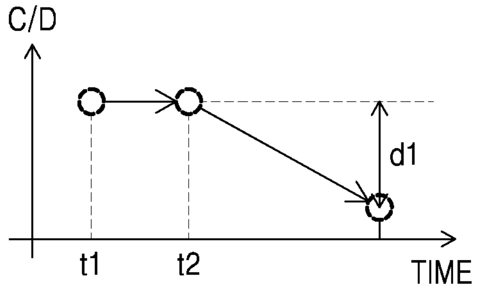
FIG. 5A is a first graph of an effect of a manufacturing method of a semiconductor element, according to an embodiment.
Figure 5B:
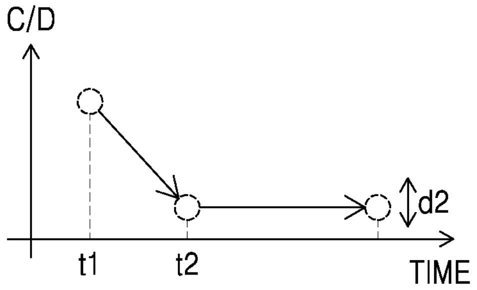
FIG. 5B is a second graph of an effect of a manufacturing method of a semiconductor element, according to an embodiment.
Figure 5C:
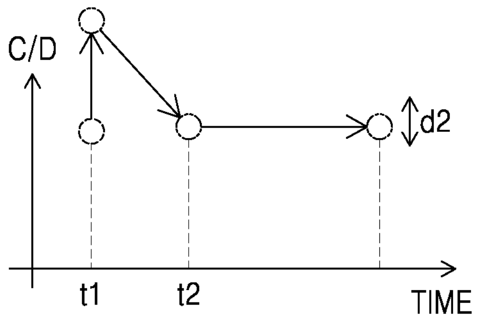
FIG. 5C is a third graph of an effect of a manufacturing method of a semiconductor element, according to an embodiment.
Figure 5D:
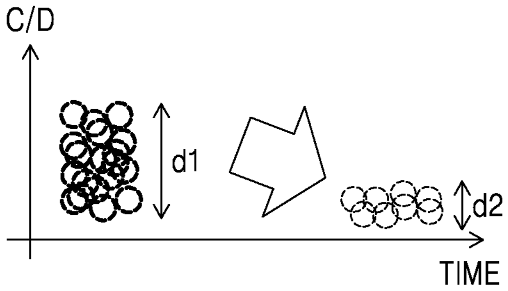
FIG. 5D is a fourth graph of an effect of a manufacturing method of a semiconductor element, according to an embodiment.

FIG. 5A illustrates a case, in which the PEB process has been performed on the wafer W, without supplying the first gas and the second gas. In addition, FIG. 5B illustrates a case in which the wafer W has been exposed to the first gas and the second gas until the PEB process. FIG. 5C illustrates a case in which the wafer has been exposed to an exposure amount less than exposure amounts used with reference to FIGS. 5A-B and to the first gas and the second gas until the PEB process. FIG. 5D is a graph of a process CD change due to the PED after the exposure process until the PEB process, with respect to the results in FIGS. 5A-C.

Accordingly, referring to FIG. 5A, the photoresist PR may be exposed to moisture during the bake process, and the CD may gradually decrease in a section after the time point t2. Referring to FIG. 5B, between time point t1 and time point t2, the photoresist PR may be exposed to the first gas and the second gas, the CD may be reduced, and the reduced CD may be maintained constant in the section after the time point t2.

Referring to FIG. 5C, the photoresist PR may be exposed to a relatively low exposure amount compared to the exposure amounts in FIGS. 5A-B, and the CD may be higher than a target CD at the time point t1. Thereafter, between time point t1 and time point t2, the photoresist PR may be exposed to the first gas and the second gas, the CD may be reduced, and in the section after the time point t2, the CD may be maintained constant at the target CD.

Referring to FIG. 5D, dl may represent the CD change amount in FIG. 5A, and d2 may represent the CD change amounts in FIGS. 5B-C. With reference to FIG. 5A, it has been identified that the photoresist PR may be exposed to moisture during the PED, and accordingly, the CD change amount dl may be large. Unlike FIG. 5A, with reference to FIGS. 5B-C, the photoresist PR has been exposed to an adjusted gas (for example, a gas containing oxygen) before the bake process, and the oxygen solubility of the photoresist PR has been saturated. As a result, it has been identified that the CD change amount d2 is low.

In this manner, by reducing the exposure amount in the exposure process, the CD may be controlled to be higher than the target CD in advance. Thereafter, by saturating the oxygen solubility of the photoresist PR by supplying the first gas and the second gas, the CD may be formed constant during the PED. Accordingly, the semiconductor element manufacturing device 100 may prevent the occurrence of semiconductor process scattering. In this manner, by manufacturing the wafer W having a certain CD, reliability for uniform treatment on the wafer W may be improved.

Figure 7:
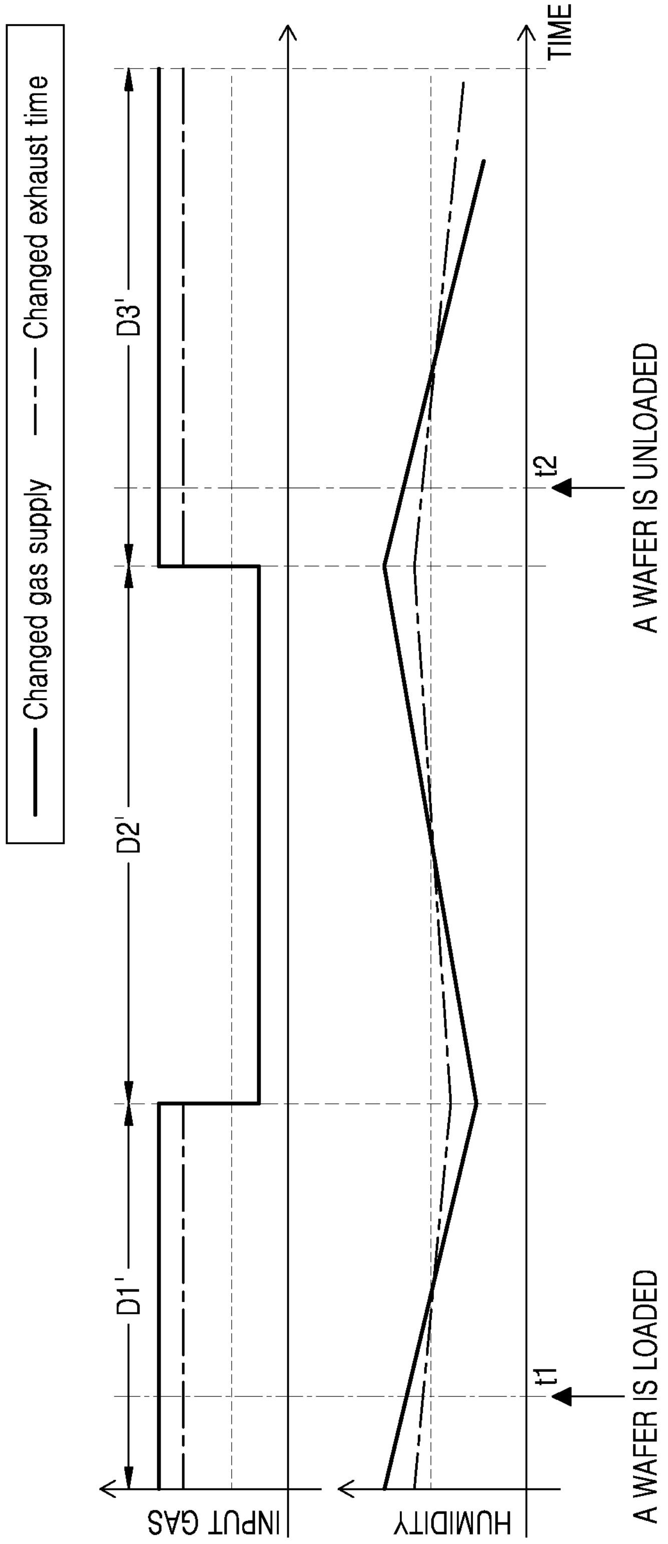
FIG. 7 is a schematic graph of an experiment example generated by a method of flow control and exhaust control, according to another embodiment.

FIG. 7 is a schematic graph of an experiment example generated by a method of flow control and exhaust control, according to another embodiment.

In FIG. 7, the sum of the first flow rate and the second flow rate of the experiment example may be illustrated as a dash-dot line, and the humidity in the bake chamber 110 of the experiment example is illustrated as another dash-dot line. The sum of the first flow rate and the second flow rate of the comparison example is illustrated as a solid line, and the humidity in the bake chamber 110 of the comparison example is illustrated as another solid line. In this case, the comparison example may be a case in which the first gas and the second gas are supplied to the bake chamber 110 (for example, the experiment example in FIG. 6), and the experiment example may illustrate a case in which exhaust is adjusted in addition to the comparison example.

Specifically, while the wafer W is loaded or unloaded in wafer loading period D1' and wafer unloading period period D3', the exhaust tube 180 is open. In wafer processing period D2, the exhaust tube 180 may be closed during a bake process (for example, the PEB).

In the semiconductor process, exhaust of a high gas flow rate may be required to remove fumes remaining in the photoresist PR inside the bake chamber 110. Due to the exhaust of the high gas flow rate, a high flow rate gas (for example, a gas having a high moisture content) may be supplied into the bake chamber 110 again.

Supplying a gas having a high moisture content at a high flow rate may cause an excessive burden on the semiconductor element manufacturing device 100. To prevent this issue, as illustrated in the wafer processing period D2' in FIG. 7, the semiconductor element manufacturing device 100 closes the exhaust valve 182 during the bake process. In addition, as illustrated in the wafer loading period D1' and the wafer unloading period D3' in FIG. 7, the exhaust valve 182 was open, while the wafer was loaded or unloaded into the bake chamber 110.

Referring to FIG. 7, in the wafer loading period D1', the sum (or, an input gas) of the first flow rate and the second flow rate of the experiment example may be greater than the reference flow rate. In the wafer loading period D1', the sum of the first flow rate and the second flow rate of the comparison example may be greater than the sum of the first flow rate and the second flow rate of the experiment example.

In the wafer processing period D2', the sum of the first flow rate and the second flow rate of the experiment example may be less than the reference flow rate. In the wafer processing period D2', the sum of the first flow rate and the second flow rate of the comparison example may be substantially the same as the sum of the first flow rate and the second flow rate of the experiment example.

In the wafer unloading period D3', the sum of the first flow rate and the second flow rate of the experiment example may be greater than the reference flow rate. In the wafer unloading period D3', the sum of the first flow rate and the second flow rate of the comparison example may be greater than the sum of the first flow rate and the second flow rate of the experiment example.

According to embodiments, the sum of the first flow rate and the second flow rate of the experiment example may be variable. According to embodiments, the sum of the first flow rate and the second flow rate of the comparison example may be variable.

According to the experiment example, the sum of the first flow rate and the second flow rate during the wafer processing period D2' may be different from the sum of the first flow rate and the second flow rate during the wafer loading period D1'. According to the experiment example, the sum of the first flow rate and the second flow rate during the wafer processing period D2' may be less than the sum of the first flow rate and the second flow rate of the experiment example during the wafer loading period D1'.

According to the experiment example, the sum of the first flow rate and the second flow rate during the wafer unloading period D3' may be different from the sum of the first flow rate and the second flow rate during the wafer processing period D2'. According to the experiment example, the sum of the first flow rate and the second flow rate during the wafer unloading period D3' may be greater than the sum of the first flow rate and the second flow rate of the experiment example during the wafer processing period D2'.

According to the experiment example, the sum of the first flow rate and the second flow rate during the wafer unloading period D3' may be substantially the same as the sum of the first flow rate and the second flow rate of the experiment example during the wafer loading period D1'.

According to the comparison example, the sum of the first flow rate and the second flow rate during the wafer processing period D2' may be less than the sum of the first flow rate and the second flow rate during the wafer loading period D1'. According to the comparison example, the sum of the first flow rate and the second flow rate during the wafer unloading period D3' may be greater than the sum of the first flow rate and the second flow rate during the wafer processing period D2'.

The maximum value of the humidity of the experiment example may be less than the maximum value of the humidity of the comparison example, and the minimum value of the humidity of the experiment example may be greater than the minimum value of the comparison example. In other words, it has been identified that the humidity of the experiment example is more uniform than the humidity of the comparison example. In this case, the uniformity of humidity may be quantified as a deviation or a peak-to-peak value. In other words, because the peak-to-peak value of the humidity of the experiment example is less than the peak-to-peak value of the humidity of the comparison example, the humidity of the experiment example is more uniform than the humidity of the comparison example.

By closing the exhaust valve 182 during the bake process and opening the exhaust valve 182 for other time periods, it is possible to further reduce the flow rate of gas (for example, the first gas and the second gas) supplied into the bake chamber 110. In addition, as illustrated by the dash-dot line, by supplying a gas having a higher flow rate than the reference flow rate before loading or unloading the wafer W, a change range of moisture is further reduced. In this manner, the stability in the bake process may be improved, by supplying a relatively low flow rate gas and reducing the change range of moisture in the bake chamber 110. In addition, the reliability of the wafer W may be improved by using the uniform processing.

Figure 8:
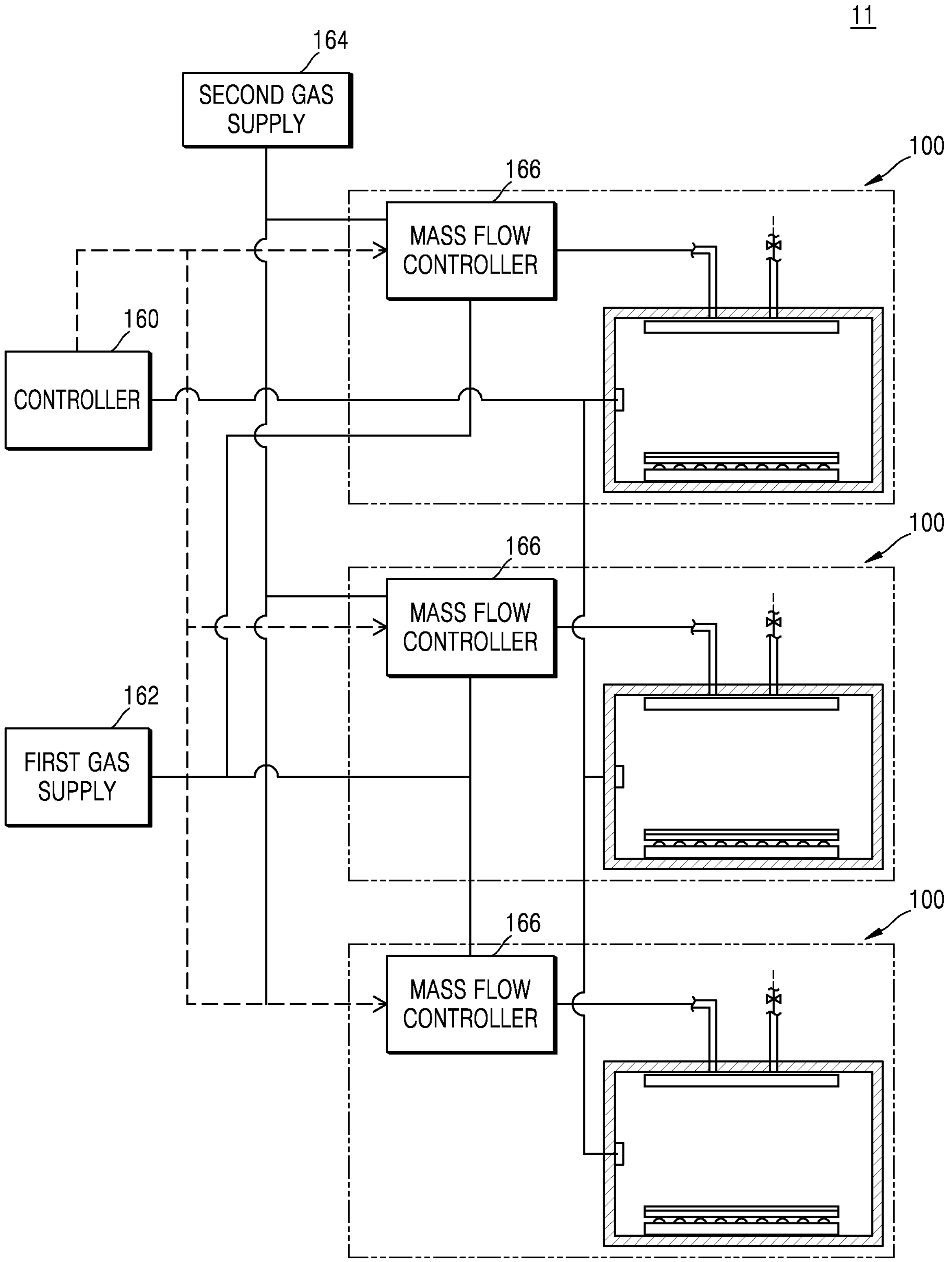
FIG. 8 is a plan view of a semiconductor element manufacturing system controlling a plurality of bake chambers, according to another embodiment.

FIG. 8 is a plan view of a semiconductor element manufacturing system 11 controlling a plurality of bake chambers 110, according to another embodiment.

Referring to FIG. 8, a plurality of the semiconductor element manufacturing device 100 may be provided, and the controller 160 may control a plurality of the mass flow controller 166 for a plurality of the bake chamber 110 (refer to FIG. 1), respectively. The controller 160 may set a flow rate control value of each of the plurality of the mass flow controller 166. In this manner, the controller 160 may control flow rates to the plurality of the bake chamber 110 differently.

The first gas supply 162 may supply the first gas. The first gas may be controlled to the first flow rate by the controller 160. The second gas supply 164 may supply the second gas. The second gas may be controlled to the second flow rate by the MFC 166. The first gas may be supplied to the plurality of the bake chamber 110, but may be supplied at a different flow rate to each of the plurality of the bake chamber 110. The second gas may also be supplied to the plurality of the bake chamber 110, but may be supplied at a different flow rate to each of the plurality of the bake chamber 110.

The controller 160 may control gas supplied to the plurality of the bake chamber 110. The controller 160 may receive temperatures and humidity for each of the plurality of bake chambers 110. The controller 160 may set a flow rate ratio of the second flow rate of the second gas to the first flow rate of the first gas, based on the temperature and humidity. In some embodiments, the controller 160 may control differently flow rates of gas supplied to each of the plurality of the bake chamber 110.

The controller 160 may monitor the temperature and humidity of the plurality of the bake chamber 110, and adjust the flow rate ratio of gas supplied to the plurality of chamber 110. By adjusting the flow rate of the gas supplied to each of the plurality of the bake chamber 110 by using the controller 160, the yield of the semiconductor element may be improved. In this manner, a condensation phenomenon in each of the plurality of the bake chamber 110 may be prevented, and the reliability of uniform treatment on the wafer W may be improved.

Figure 9:
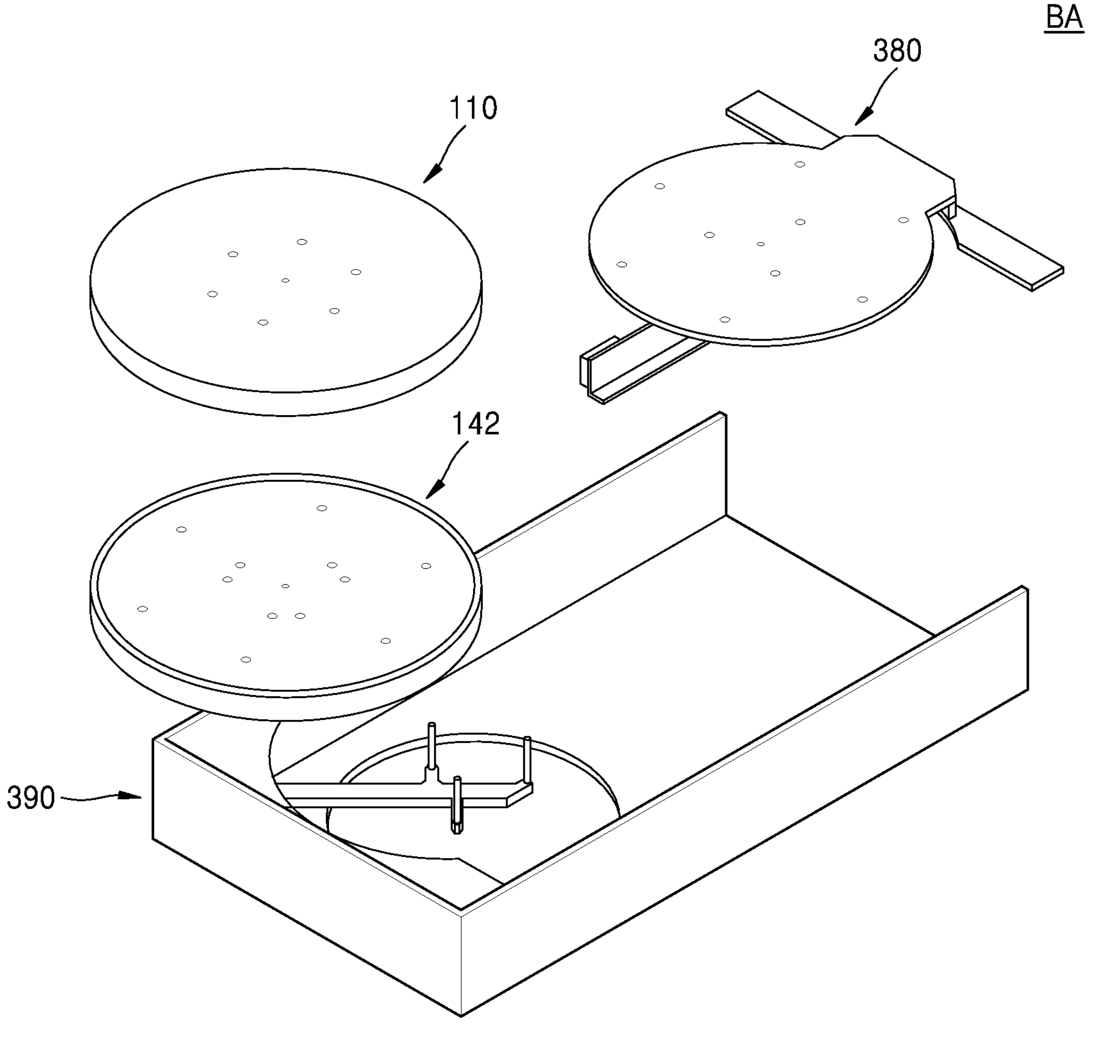
FIG. 9 is a schematic perspective view of a bake apparatus, according to an embodiment.

FIG. 9 is a schematic perspective view of a bake apparatus BA, according to an embodiment.

Referring to FIG. 9, the bake apparatus BA may include the bake chamber 110, a transfer robot 380, and a base module 390, in addition to the first heating plate 142 in FIG. 1.

The transfer robot 380 may introduce the wafer W into the bake apparatus BA, or take the processed wafer W out of the bake apparatus BA.

The bake chamber 110 may include an exhaust structure (for example, the exhaust tube 180) for exhausting gas generated while the wafer W is heated. The bake chamber 110 may isolate the wafer W from the outside during the process. The bake chamber 110 may prevent heat for treating the wafer W from leaking therefrom, and prevent the wafer W from being contaminated by particles outside the bake chamber 110. The bake chamber 110 may be configured to cover both the first heating plate 142 and the wafer W, or cover only the wafer W.

The base module 390 may support various components included in the bake apparatus BA, such as the first heating plate 142 and the bake chamber 110.

When the wafer W is transferred by the transfer robot 380, the bake chamber 110 may be opened, the wafer W may be mounted on the first heating plate 142 by using the transfer robot 380, and the bake chamber 110 may be closed. Next, when the wafer W is sufficiently heated, the bake chamber 110 may be opened again, and the wafer W may be taken out by the transfer robot 380.

Figure 10:
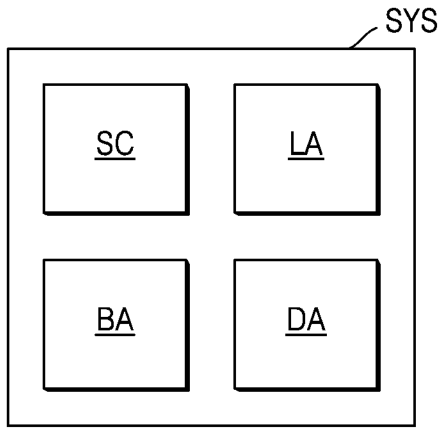
FIG. 10 is a block diagram of a system including a bake apparatus, according to an embodiment.

FIG. 10 is a block diagram of a system SYS including the bake apparatus BA, according to an embodiment.

Referring to FIG. 10, the system SYS may include a spin coater SC, a lithography apparatus LA, the bake apparatus BA, and a development apparatus DA.

A process performed by the system SYS may include manufacturing a semiconductor structure implemented on a semiconductor wafer or the wafer W. The process performed by the system SYS may include a semiconductor process by using, for example, DUV or EUV light.

The spin coater SC may provide the photoresist PR on a semiconductor structure in a method of spin coating.

The bake apparatus BA may include the bake apparatus BA described with reference to FIG. 9. According to some embodiments, the bake apparatus BA may perform the soft baking process after the photoresist PR is applied on the wafer W by the spin coater SC. According to some embodiments, after the exposure process by the lithography apparatus LA is performed, the bake apparatus BA may further perform the hard bake process following the POB process and the development process by the development apparatus DA.

The lithography apparatus LA may perform an EUV lithography process. The lithography apparatus LA may include a measurement station and an exposure station.

The lithography apparatus LA may include a dual stage-type apparatus including two wafer tables. The two wafer tables may be the measurement station for measurement and the exposure station for exposure. Accordingly, while the semiconductor structure on one wafer table is exposed, a pre-exposure measurement of the semiconductor structure on the other wafer table may be performed. Because it takes a long time to measure alignment marks, and the lithography process is a bottleneck process of the entire semiconductor process, the productivity of the semiconductor element may be improved by providing the two wafer tables. However, the embodiment is not limited thereto, and the lithography apparatus LA may include a mono stage-type lithography apparatus including one wafer table.

The development apparatus DA may develop the exposed photoresist PR, and form a photoresist PR pattern.

According to some embodiments, the system SYS may further include an inspection apparatus for post-exposure inspection. The inspection apparatus may include an angle-resolved scatterometer or a scatterometer, such as a spectroscopic scatterometer.

The system SYS may further include, for example, an etching apparatus. The etching apparatus may etch the wafer W by using the developed photoresist PR pattern as an etching mask. In some other example embodiments, the system SYS may further include apparatuses for performing an ion implant process, a deposition process, etc.

According to embodiments of the present disclosure, at least one from among the controller 160, the MFC 166, and the temperature controller 190 may include at least one computer processor and memory storing computer instructions that, when executed by the at least one computer processor, are configured to cause the controller 160, the mass flow controller 166, and/or the temperature controller 190 to perform its functions described in the present disclosure.

While non-limiting example embodiments of the present disclosure have been particularly shown and described with reference to the drawings, it will be understood that various changes in form and details may be made thereto without departing from the spirit and scope of the present disclosure.

What is claimed is:

1. A manufacturing method of a semiconductor element, the manufacturing method comprising:
- providing a photoresist on a wafer;
- supplying a first gas, containing oxygen, at a first flow rate to a bake chamber, and supplying a second gas, which is oxygen-free, at a second flow rate to the bake chamber; and
- performing a bake process on the wafer in the bake chamber,
- wherein the supplying the first gas at the first flow rate comprises saturating oxygen solubility of the photoresist.

2. The manufacturing method of claim 1, further comprising performing an exposure process on the wafer after the bake process.

3. The manufacturing method of claim 1, wherein the supplying the first gas and the second gas to the bake chamber comprises supplying the first gas and the second gas to the bake chamber before the wafer is loaded in the bake chamber.

4. The manufacturing method of claim 1, wherein the first gas and the second gas are mixed before being supplied to the bake chamber.

5. The manufacturing method of claim 1, wherein the photoresist is provided by using a chemical vapor deposition (CVD) process or a spin coating process.

6. The manufacturing method of claim 1, wherein the performing the bake process on the wafer comprises:
- heating the wafer;
- sensing a temperature near the wafer; and
- adjusting the first flow rate of the first gas and the second flow rate of the second gas, based on the temperature near the wafer.

7. The manufacturing method of claim 1, wherein the performing the bake process on the wafer comprises:
- measuring humidity inside the bake chamber; and
- adjusting the first flow rate of the first gas and the second flow rate of the second gas, based on the humidity.

8. The manufacturing method of claim 1, wherein the performing the bake process on the wafer comprises:
- heating the wafer;
- sensing a temperature near the wafer;
- measuring humidity inside the bake chamber; and
- adjusting the first flow rate of the first gas and the second flow rate of the second gas, based on the temperature near the wafer and the humidity inside the bake chamber.

9. A manufacturing method of a semiconductor element, the manufacturing method comprising:
- performing an exposure process in which a wafer is exposed at an exposure amount of 55 mJ to 60 mJ;
- supplying a first gas, containing oxygen, at a first flow rate to a bake chamber, and supplying a second gas, which is oxygen-free, at a second flow rate to the bake chamber;
- loading the wafer into the bake chamber after performing the exposure process;
- performing a bake process on the wafer after loading the wafer into the bake chamber; and
- performing a development process on the wafer after performing the bake process.

10. The manufacturing method of claim 9, wherein a flow rate ratio of the second flow rate of the second gas to the first flow rate of the first gas in the bake chamber is in a range of 0.1 to 1.5.

11. The manufacturing method of claim 10, wherein the supplying the first gas and the second gas comprises supplying the first gas and the second gas to the bake chamber for 1 minute to 5 minutes such that oxygen solubility of a photoresist on the wafer becomes saturated before performing the bake process.

12. The manufacturing method of claim 10, wherein the supplying the first gas and the second gas comprises increasing or decreasing the first flow rate and the second flow rate in a range of 30% of a predetermined reference flow rate.

13. The manufacturing method of claim 9, wherein the supplying the first gas and the second gas comprises increasing, during the loading of the wafer, a sum of the first flow rate of the first gas and the second flow rate of the second gas to be greater than a predetermined reference flow rate.

14. The manufacturing method of claim 9, further comprising unloading the wafer from the bake chamber after the performing the bake process,
- wherein the supplying the first gas and the second gas comprises increasing, during the unloading of the wafer, a sum of the first flow rate of the first gas and the second flow rate of the second gas to be greater than a predetermined reference flow rate.

15. The manufacturing method of claim 14, wherein the supplying the first gas and the second gas to the bake chamber comprises decreasing the sum of the first flow rate of the first gas and the second flow rate of the second gas to be less than the predetermined reference flow rate while the wafer is in the bake chamber before performing the bake process.

16. The manufacturing method of claim 9, wherein the first gas containing the oxygen comprises a gas containing moisture.

17. The manufacturing method of claim 9, wherein the performing the bake process on the wafer further comprises:

heating the wafer;

sensing a temperature near the wafer; and adjusting the first flow rate of the first gas and the second flow rate of the second gas, based on the temperature near the wafer.

18. The manufacturing method of claim 9, wherein the performing the bake process on the wafer further comprises:

measuring humidity inside the bake chamber; and adjusting the first flow rate of the first gas and the second flow rate of the second gas, based on the humidity.

19. A manufacturing method of a semiconductor element, the manufacturing method comprising:

providing a photoresist on a wafer;

supplying a first gas, containing oxygen, at a first flow rate to a bake chamber, and supplying a second gas, which is oxygen-free, at a second flow rate to the bake chamber; and performing a first bake process on the wafer in the bake chamber, wherein, in the performing of the first bake process, a sum of the first flow rate of the first gas and the second flow rate of the second gas supplied to the bake chamber is reduced to be less than a predetermined reference flow rate, and a gas inside the bake chamber is not exhausted.

20. The manufacturing method of claim 19, further comprising:

performing an exposure process on the wafer after the performing the first bake process;

performing a second bake process on the wafer after the performing the exposure process; and performing a development process on the wafer after the performing the second bake process, wherein the performing of the second bake process on the wafer comprises:

loading the wafer into the bake chamber;

heating the wafer; and unloading the wafer from the bake chamber, wherein the supplying the first gas and the second gas comprises increasing, while loading the wafer and unloading the wafer during the second bake process, a sum of the first flow rate of the first gas and the second flow rate of the second gas supplied to the bake chamber to be greater than a predetermined reference flow rate, and wherein the manufacturing method further comprises exhausting the gas inside the bake chamber while loading the wafer and unloading the wafer during the second bake process.

* * * * *